United States Patent
Wise et al.

(10) Patent No.: US 9,922,839 B2
(45) Date of Patent: Mar. 20, 2018

(54) LOW ROUGHNESS EUV LITHOGRAPHY

(71) Applicant: Lam Research Corporation, Fremont, CA (US)

(72) Inventors: Richard Wise, Los Gatos, CA (US); Nader Shamma, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/189,317

(22) Filed: Jun. 22, 2016

(65) Prior Publication Data

US 2016/0379824 A1 Dec. 29, 2016

Related U.S. Application Data

(60) Provisional application No. 62/183,658, filed on Jun. 23, 2015.

(51) Int. Cl.
*H01L 21/3065* (2006.01)
*H01L 21/033* (2006.01)
*H01L 21/308* (2006.01)
*H01L 21/31* (2006.01)
*H01L 21/027* (2006.01)
(Continued)

(52) U.S. Cl.
CPC .... *H01L 21/30655* (2013.01); *H01L 21/0273* (2013.01); *H01L 21/0332* (2013.01); *H01L 21/0337* (2013.01); *H01L 21/3065* (2013.01); *H01L 21/3086* (2013.01); *H01L 21/31* (2013.01); *H01L 21/31116* (2013.01);
(Continued)

(58) Field of Classification Search
None
See application file for complete search history.

(56) References Cited

U.S. PATENT DOCUMENTS 8,722,543 B2  5/2014  Belen et al.
9,034,748 B2  5/2015  Baiocco et al.
(Continued)

OTHER PUBLICATIONS

K. K Petrillo et al., "Resist Process Applications to IMprove EUV Patterning", Proc. of SPIE, vol. 8679, year 2013, pp. 867911-1 to 867911-12.*

(Continued)

*Primary Examiner* — Jiong-Ping Lu
(74) *Attorney, Agent, or Firm* — Weaver Austin Villeneuve & Sampson LLP

(57) ABSTRACT

Provided herein are methods and related apparatus to smooth the edges of features patterned using extreme ultraviolet (EUV) lithography. In some embodiments, at least one cycle of depositing passivation layer that preferentially collects in crevices of a feature leaving protuberances exposed, and etching the feature to remove the exposed protuberances, thereby smoothing the feature, is performed. The passivation material may preferentially collect in the crevices due to a higher surface to volume ratio in the crevices than in the protuberances. In some embodiments, local critical dimension uniformity (LCDU), a measure of roughness in contact holes, is reduced. In some embodiments, at least one cycle of depositing a thin layer in a plurality of holes formed in photoresist, the holes having different CDs, wherein the thin layer preferentially deposits in the larger CD holes, and anisotropically removing the thin layer to remove it at the bottoms of the holes, is performed.

16 Claims, 9 Drawing Sheets

(51) Int. Cl.
*H01L 21/311* (2006.01)
*H01L 21/3213* (2006.01)

(52) U.S. Cl.
CPC .. *H01L 21/31122* (2013.01); *H01L 21/31144* (2013.01); *H01L 21/32137* (2013.01)

(56) References Cited

U.S. PATENT DOCUMENTS

| | | | |
|---|---|---|---|
| 2006/0205220 A1* | 9/2006 | Hudson | H01L 21/0273 438/694 |
| 2009/0286400 A1* | 11/2009 | Heo | H01L 21/0273 438/694 |
| 2011/0045672 A1 | 2/2011 | Srinivasan et al. | |
| 2014/0187035 A1 | 3/2014 | Posseme et al. | |
| 2014/0213060 A1 | 7/2014 | Kao et al. | |

OTHER PUBLICATIONS

Office Action dated Oct. 21, 2016, in U.S. Appl. No. 15/061,359.
Final Office Action dated Mar. 13, 2017, in U.S. Appl. No. 15/061,359.
U.S. Appl. No. 15/061,359, filed Mar. 4, 2016, Kabansky et al.

\* cited by examiner

LOW ROUGHNESS EUV LITHOGRAPHY

CROSS-REFERENCE TO RELATED APPLICATION

This application claims the benefit of priority to U.S. Provisional Patent Application No. 62/183,658, filed Jun. 23, 2015, which is incorporated by reference herein in its entirety.

BACKGROUND

Patterning methods are critical to semiconductor processing. In particular, extreme ultraviolet (EUV) lithography has been explored to extend lithographic technology beyond its optical limits and replace current photolithography methods to pattern small critical dimension features. Current EUV lithography methods result in poor edge roughness and weak patterns that may ultimately render the substrate useless.

SUMMARY

Aspects of the disclosure relate to methods and related apparatus to smooth the edges of features patterned using extreme ultraviolet (EUV) lithography. In some embodiments, at least one cycle of depositing passivation layer that preferentially collects in crevices of a feature leaving protuberances exposed, and etching the feature to remove the exposed protuberances, thereby smoothing the feature, is performed. The passivation material may preferentially collect in the crevices due to a higher surface to volume ratio in the crevices than in the protuberances. In some embodiments, local critical dimension uniformity (LCDU), a measure of roughness in contact holes, is reduced. In some embodiments, at least one cycle of depositing a thin layer in a plurality of holes formed in photoresist, the holes having different CDs, wherein the thin layer preferentially deposits in the larger CD holes, and anisotropically removing the thin layer to remove it at the bottoms of the holes, is performed.

In some embodiments, a method involves receiving a substrate including a plurality of holes including sidewalls and bottoms patterned in one or more layers on the substrate, the holes patterned with a nominal critical dimension (CD) and having a first local critical dimension uniformity (LCDU) (3 sigma); and performing a multi-cycle deposition-etch operation in the one or more layers, wherein each cycle includes (a) depositing a first material in the holes and (b) removing the first material from the bottoms of the holes, wherein a chamber pressure of chamber in which the substrate is disposed is higher during (b) than (a), wherein the holes have a second LCDU (3 sigma) after the multi-cycle deposition, with the second LCDU (3 sigma) is less than the first LCDU (3 sigma).

In some embodiments, the holes are patterned with an EUV dose of less than about 40 mJ/cm2. In some embodiments, the second LCDU (3 sigma) is less than 3 nm. In some such embodiments, the first LCDU (3 sigma) is greater than 5 nm. In some embodiments, the difference between the first and second LCDU (3 sigma) is at least 1 nm.

In some embodiments, the multi-cycle deposition-etch operation is a plasma-assisted operation. In some embodiments, the multi-cycle deposition-etch operation is performed in a single chamber and transitioning between deposition and etch incldusе changing the chamber pressure. In some embodiments, the one or more layers is a polymeric or non-polymeric resist and (a) includes exposing the pattern of holes to methane (CH4). In some embodiments, (b) includes exposing the pattern of holes to plasma generated from nitrogen (N2) gas.

In some embodiments, during (a), the first material is preferentially deposited in larger holes of the plurality of holes. In some embodiments, the holes have a second CD after the multi-cycle deposition, with the second CD is less than the first CD. In some embodiments, the holes have a second CD after the multi-cycle deposition, with the second CD is greater than the first CD.

Another aspect of the disclosure involves methods including receiving a substrate including a feature selected from a line or hole patterned by EUV in one or more layers on the substrate, the feature including sidewalls having crevices and protuberances; depositing a passivation layer on the feature sidewalls such that the passivation layer preferentially deposits in crevices leaving protuberances exposed; and etching the feature to remove the exposed protuberances.

In some embodiments, the one or more layers includes an amorphous carbon film and depositing a passivation layer includes exposing the feature to a plasma generated from a sulfur oxide. In some embodiments, the one or more layers includes an amorphous silicon film and depositing a passivation layer includes exposing the feature to a plasma generated from a fluorocarbon. In some embodiments, the one or more layers includes a resist polymer and depositing a passivation layer includes exposing the feature to a plasma generated from methane. In some embodiments, removing the protuberances includes an atomic layer etching (ALE) process.

Another aspect of the disclosure relates to method including providing a contact hole array patterned by EUV at a dose of no more than 40 mJ/cm2, the holes patterned with a nominal critical dimension (CD) and having a first local critical dimension uniformity (LCDU) (3 sigma); and performing one or more smoothening operations to reduce the LCDU (3 sigma) by at least 2 nm.

These and other aspects of the disclosure are described below with reference to the Figures.

DESCRIPTION

Figure 1:
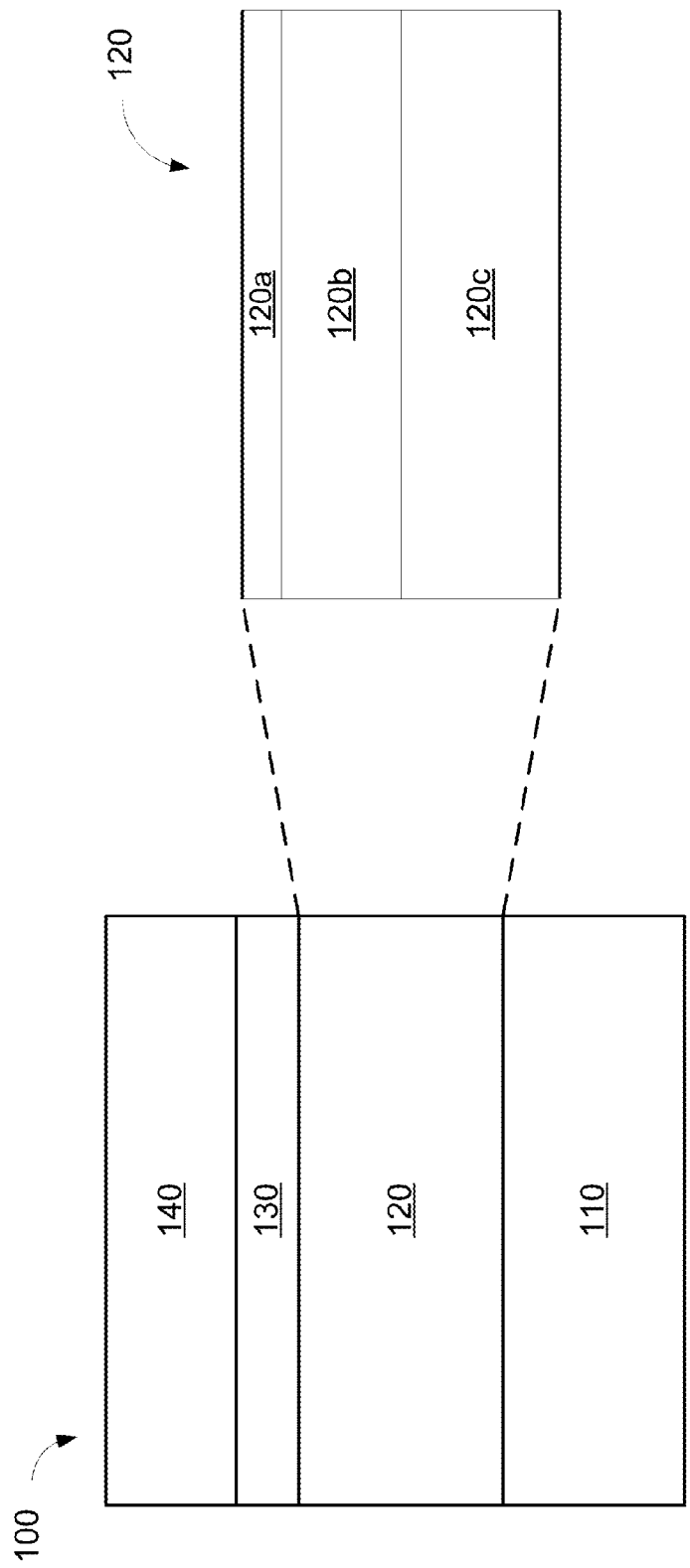
FIG. 1 is a schematic illustration of an example of a multi-layer stack on a semiconductor substrate.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Patterning of thin films in semiconductor processing is often a critical step in the manufacture and fabrication of semiconductors. Conventional stacks for lithography often include a photoresist layer on top of an underlayer, which is typically deposited on a hardmask by spin-on methods. The hardmask is often made of one composition, and the hardmask itself is deposited on a target layer. Conventional patterning involves photolithography, such as 193 nm lithography. In photolithography, patterns are printed by emitting photons from a photon source onto a mask and printing the pattern onto a photosensitive photoresist, thereby causing a chemical reaction in the photoresist that removes certain portions of the photoresist to form the pattern. In conventional lithography, the number of photons that may hit the photoresist may vary. In many practices, a large number of photons hit the photoresist, with each photon carrying less energy. Since a large number of photons may be used, the error due to some stray photons does not substantially affect the resulting defined pattern.

As devices shrink, the need for printing smaller features increases. Although multiple patterning techniques have been developed for use with conventional photolithography, multiple patterning uses multiple layers of deposition and etching processes. Scaling of features on advanced semiconductor integrated circuits (ICs) and other devices has driven lithography to improve resolution by moving to ever smaller imaging source wavelengths.

Extreme ultraviolet (EUV) lithography has been developed to print smaller patterns on a photoresist using EUV light sources at approximately 13.5 nm wavelength in leading-edge lithography tools, which are also referred to as scanners. The EUV radiation is strongly absorbed in a wide range of materials, including quartz and water, and so operates in a vacuum.

In EUV lithography, fewer photons are emitted from the source and the photons hit the photoresist to form the pattern. Each of the photons carries higher energy than the photons used in conventional lithography. Moreover, in EUV lithography fewer higher energy photons hit the photoresist so a few stray photons that miss the photosensitive sites may cause a larger error in the defined pattern. Compared to conventional lithography where more lower-energy photons are used and a few stray photons may not affect the pattern substantially, the stochastic effect due to this photon and sensitizer shot noise in EUV lithography is of particular concern.

Provided herein are techniques to smooth the edges of features patterned using EUV techniques. The techniques may be applied with any EUV patterning scheme, including those in which a single stack or multi-layer stack is used. For example, in some embodiments, multi-layer stack may be used to form lines or spaces or contacts and holes in integrated circuits and may form features for advanced technology nodes, as defined by the International Technology Roadmap for Semiconductors. Examples of these advanced technology nodes include 22 nm nodes, 16 nm nodes, 10 nm nodes and beyond. In the 16 nm node, the width of a typical via or line in a Damascene structure is no greater than about 30 nm. Although the description below chiefly describes EUV, the techniques provided herein may be effectively used in other current and next-generation patterning techniques to smooth feature edges and tune critical dimensions of features.

As noted above, the techniques disclosed herein may be used with single stack or multi-layer patterning schemes. FIG. 1 is a schematic illustration of an example of a multi-layer stack on a semiconductor substrate. The wafer 100 includes a target layer 110, a multi-layer stack 120, an optional underlayer 130, and a photoresist 140. The target layer 110 may be any target layer or substrate, such as a metal, an oxide, a dielectric material, or an ultra-low-k (ULK) substrate. In many embodiments, the target layer 110 is a silicon substrate.

The multi-layer stack 120 includes a layer 120a, and underlayers 120b and 120c. According to various embodiments, the multi-layer stack 120 includes only two underlayers (as shown in multi-layer stack 120), or more than two underlayers, or three or more than three underlayers, or four or more than four underlayers, or five or more than five underlayers. In some embodiments, optional underlayer 130 is included as part of the multi-layer stack 120. Optional underlayer 130 may be a spin-on layer or a layer deposited by plasma-enhanced chemical vapor deposition (PECVD). As an example, FIG. 1 depicts two underlayers 120b and 120c, as well as a layer 120a. In some embodiments, layer 120a may be an atomically smooth layer. Multi-layer stacks including atomically smooth layers are described in U.S. patent application Ser. No. 14/185,757, filed Feb. 20, 2014 and titled "PECVD FILMS FOR EUV LITHOGRAPHY," which is incorporated by reference herein.

In various embodiments, the underlayer adjacent to target layer 110 (i.e., underlayer 120c in the example of FIG. 1) is a robust hardmask layer, with robustness characterized by the modulus and stress of the layer. For example, robust hardmask layers may have a modulus of at least 100 MPa and a stress less than about 500 MPa. In many embodiments, underlayer 120c, or other underlayer adjacent to the target layer 110, is an amorphous carbon layer. In some embodiments, the modulus to stress ratio of an underlayer 120c of amorphous carbon is at least about 1:1. Examples of robust hardmask layers used for underlayer 110 may also include diamond-like carbon (DLC), doped amorphous carbon, and spin-on carbon (SoC).

In various embodiments, underlayers 120b and 120c may be removable after transferring a pattern to a subsequent layer. For example, underlayer 120b may be removed after a pattern is transferred to underlayer 120c. In some embodiments, underlayers 120b and 120c may reflect, or refract, or absorb a leveling beam emitted on the substrate to measure wafer levelness.

The composition of underlayers 120b and 120c may be selected from one of many classes of compositions, such as oxides, metals (e.g., hafnium, cobalt, tungsten, titanium) or conductive films (e.g., titanium nitride, titanium silicide, cobalt silicide), dielectric materials (e.g., silicon oxide, silicon nitride, spin-on-glass (SOG)), hardmask materials (e.g., amorphous carbon, amorphous silicon), or others such as silicon oxynitride (SiON), nitrogen-free anti-reflective layer (NFARL), or silicon anti-reflective coating (SiARC).

In one example, underlayer 120b is an amorphous silicon layer and underlayer 120c is an amorphous carbon layer. In many embodiments, underlayer 120b and underlayer 120c may each be between about 100 Å and about 900 Å thick.

Underlayers 120b and 120c are selected based on their etch contrast relative to adjacent layers. In many embodiments, underlayer 120b has a high etch contrast relative to underlayer 120c and also has a high etch contrast relative to 120a. In various embodiments, underlayer 120c has a high etch contrast relative to both underlayer 120b and target layer 110. For example, if underlayer 120c is an amorphous carbon layer, underlayer 120b may have high etch contrast to both the atomically smooth layer 120a and the amorphous carbon underlayer 120c.

Underlayers 120b and 120c may also be selected based on other optimizable properties, such as physical properties, chemical properties, and optical properties. Examples of such properties may include surface energy, bonding structure, hydrophobicity, refractive index, and extinction coefficient.

The layer 120a may be a thin layer deposited in a layer near the top of the multi-layer stack, such as the first or second layer below the photoresist 140. The layer 120a may be an atomically smooth layer characterized by its very low roughness. "Atomically smooth" is defined as having a roughness of less than 1 monolayer, or about half a monolayer of deviation from the mean line. "Local" roughness is defined as the roughness in 1 square micron of surface area of a wafer. Roughness of a layer may be evaluated by observation and by atomic force microscopy (AFM). The roughness may be measured by the average of the vertical deviations of the roughness profile from the mean line. In one example, an atomically smooth layer 120a may have an average roughness of less than about 2 Å. Roughness may also be measured by the root mean square (RMS) of vertical deviations of the roughness profile from the mean line.

In some embodiments, the thickness of the layer 120a may be between about 30 Å and about 60 Å. The layer 120a may have high etch contrast to adjacent layers and may also be removable after transferring the pattern to a subsequent layer. In various embodiments, the layer 120a is an oxide layer. In some examples, the layer 120a is a thin layer of silicon oxide.

A multi-layer stack as depicted in FIG. 1 may be used in EUV lithography by using a shrinking effect. A larger feature is printed on the photoresist using EUV lithography, and the feature is shrunk as each layer is etched down the multi-layer stack, thereby reducing roughness caused by photon and sensitizer shot noise described above. In many embodiments, the feature printed on the photoresist shrinks such that the patterned features in the target layer have a critical dimension less than or equal to about 70% of the size or width of the critical dimension of the pattern in the photoresist. The percentage of the shrinkage may be optimized by various etch processes. The percentage of shrinkage may also be limited by pitch.

Thinner photoresist films may be used with multi-layer stacks, thereby reducing the exposure dose used to pattern the photoresist. For example, reducing the photoresist thickness from approximately 1000 Å to approximately 300 Å may significantly reduce the dose needed to expose the photoresist, which thereby improves the scanner throughput. The photoresist may also serve as a mask during reactive ion etching (ME) of the underlying films to transfer the mask pattern onto the target layer. Where the photoresist serves as a mask for this purpose, the lower limit on the photoresist thickness may be determined by the minimum thickness of the photoresist to enable use as a mask.

In addition to the shrinking effect described above, various techniques for smoothening EUV patterned features are provided herein. While these techniques may be used with multi-layer stacks having relatively thin photoresist layers, they may also be advantageously used with single layers and stacks including thick photoresist layers. Further, as noted above the techniques are not limited to EUV at 13.5 nm, but may be used with EUV at other wavelengths and with other next-generation patterning techniques where roughness is an issue.

The techniques provided herein result in low roughness. For example, features patterned using EUV may have low line edge roughness (LER) using the techniques disclosed herein. Line edge roughness may be defined as the deviation of a feature edge (as viewed top-down) from a smooth, ideal shape—that is, the edge deviations of a feature that occur on a dimensional scale smaller than the resolution limit of the imaging tool that was used to print the feature. The magnitude of LER may be affected by a multitude of factors, including the photon shot noise in the exposing radiation, the stochastic nature of the dissolution of the photoresist in the developer, the metrology noise introduced by a scanning electron microscope, and chemical interactions between the photoresist and underlying film. Sidewall roughness on the patterned photoresist may be highly anisotropic and the roughness may propagate from the photoresist-substrate interface up the photoresist pattern sidewall. In ultrathin photoresist films, which may be about 100 nm in thickness or less, roughness may be correlated from the photoresist-substrate interface to the photoresist-air interface for a number of different photoresist material platforms. In EUV lithography, particularly for high volume manufacturing, photoresist LER is desired to be less than about 1 nm (3σ). As each layer is etched down in a multi-layer stack, the walls of the feature are smoothed and LER may be optimized to be closer to less than 1 nm. The features patterned may also be characterized by local critical dimension (CD) uniformity (LCDU). LCDU is the hole-to-hole CD variation on a local scale, defined as 3 sigma value of the CD distribution. According to various embodiments, features having LCDU of 2.5 nm or less (3σ) may be provided. In some embodiments, the LCDU is the field of view LCDU (3σ), which is the 3 sigma of all contact holes (or other features) within a field of view. LCDU is a common measure of roughness in contact holes and can be the result of shot noise, mask, and metrology components.

Figure 2:
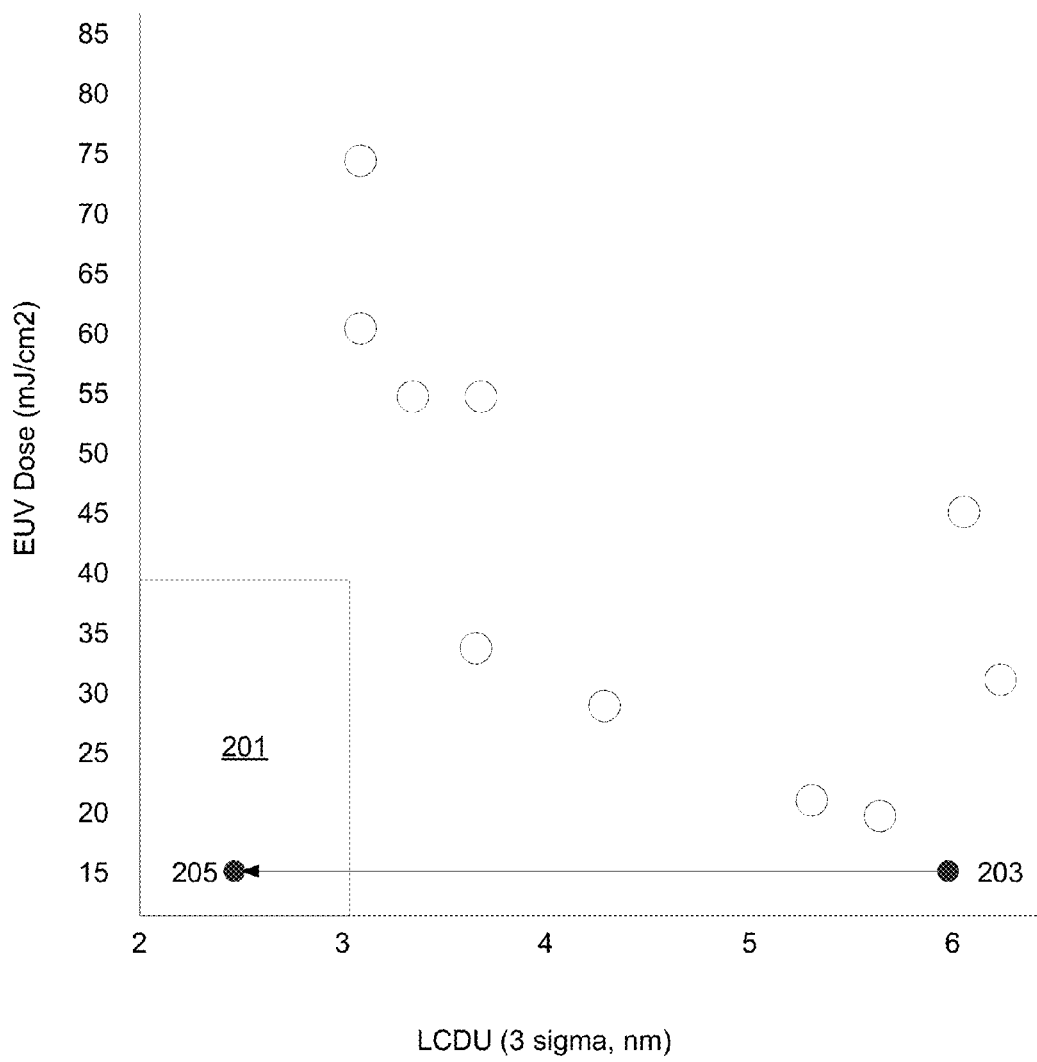
FIG. 2 shows a graph that schematically illustrates the relation between extreme ultraviolet (EUV) dose and local critical dimension uniformity (LCDU).

In some embodiments, the techniques provided herein smooth features patterned using low dose EUV. FIG. 2 shows a graph that schematically illustrates the relation between EUV dose and LCDU. The dots show the dose/LCDU for various representative resists. As can be seen from FIG. 2, very high doses (e.g., greater than 60 mJ/cm2) are used to obtain LCDU's of about 3 nm. As dose decreases, roughness increases, with LCDU's of greater than 5 nm generated from doses of 30 mJ/cm2 and lower. An example dose/LCDU target zone 201 is indicated in FIG. 2, with an EUV dose of no more than about 40 mJ/cm2 and a LCDU of no more than about 3 nm. To date, no resists are capable of patterning in the target zone.

While the smoothening techniques disclosed herein may be used with any resist and EUV dose, in some embodiments, a low EUV dose is used to generate intentionally rough features that are then smoothed by the techniques disclosed herein. In this manner, a dose/LCDU in the target zone may be obtained. In an example depicted in FIG. 2, a LCDU of about 2.5 nm (205) may be obtained by a low dose patterning at 15 mJ/cm2 to obtain relatively rough features (203), followed by one or more smoothening techniques as described herein. According to various embodiments, the methods disclosed herein may include receiving features patterned by EUV at doses of no more than 40 mJ/cm2, no more than 30 mJ/cm2, or no more than 15 mJ/cm2 or even lower doses. Example LCDU's may be about 5 nm or 6 nm at these doses. The methods further include reducing the roughness. Examples of techniques to reduce roughness and smoothen features are described below.

The various techniques described below may be applied at any appropriate step in transferring a pattern in an exposed EUV resist to a target layer. This includes smoothening features in a resist layer or one or more intermediate layers. In some embodiments, one or more techniques may be performed at multiple pattern transfer steps. In some embodiments, an amorphous hard mask layer (such as underlayer 120c in FIG. 1) is the thickest part of the stack and may provide the most opportunity for smoothening.

As discussed further below, various techniques involve deposition of a passivation layer that reduces etch rate. A passivation chemistry may be applied during an etch operation or may be applied in an alternating sequence with an etchant. If applied during an etch operation, the passivation chemistry may be supplied in the same or a different compound than the primary etchant. For example, in fluorocarbon plasma etching of dielectrics, a CxFy polymer passivation layer may be deposited. In another example, sulfur and carbon may form a passivation layer during a SO2/O2 etch of a carbonaceous layer. Passivating chemistries may depend on the etch chemistry as well as the material being passivated. Any appropriate passivation chemistry may be used, with examples including sulfur-containing such as sulfur dioxide (SO2) compounds to passivate amorphous carbon (a-C) films, fluorocarbons such as C4F6 and C4F8 to passivate amorphous silicon (a-Si) and oxide films, and methane (CH4) to passivate resist polymers or non-polymer resists. Hydrogen bromide (HBr) may also be used to passivate carbon-containing and silicon-containing films.

Preferential Removal of Protuberances

Figure 3:
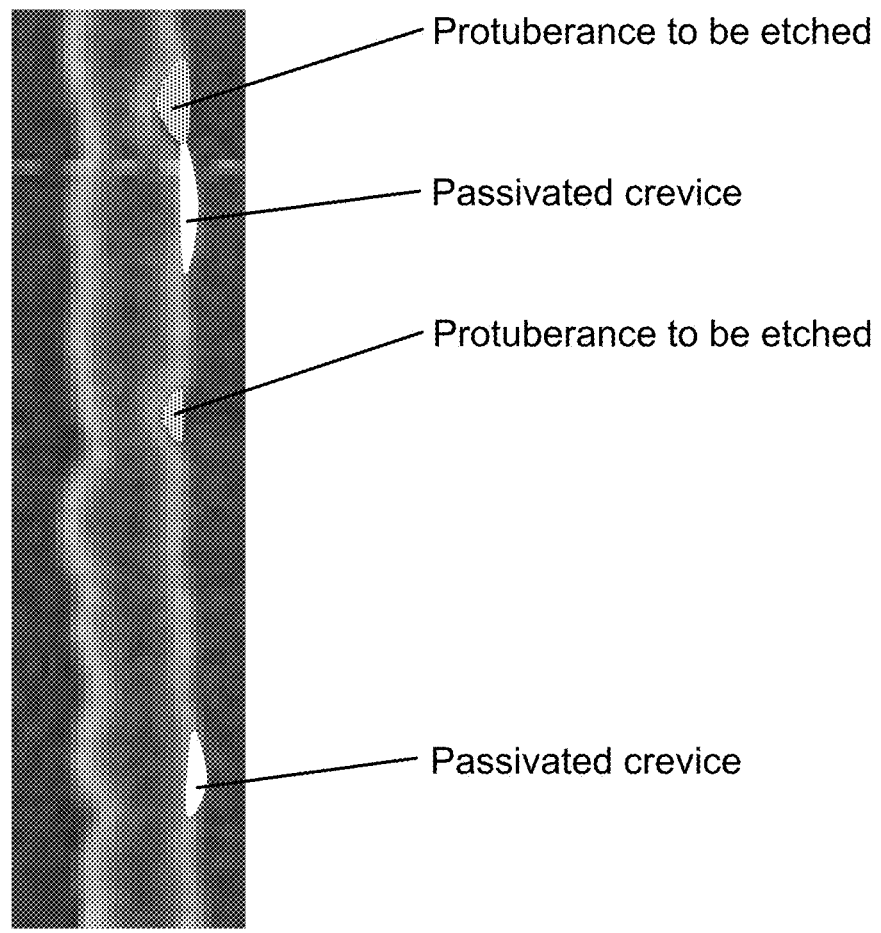
FIG. 3 shows an example of a feature schematically illustrating crevices including a passivation material and protuberances to be etched.

Roughness of a feature, such as a line or hole, may be characterized as protuberances and crevices along a side or other edge of a feature. In some embodiments, one or more cycles of 1) applying a thin passivation layer on a feature that preferentially collects in crevices leaving protuberances exposed, and 2) etching the feature to remove the exposed protuberances, thereby smoothing the feature, are performed. The passivation layer is thinner than at least the largest protuberances. The passivation material may preferentially collect in the crevices due to a higher surface to volume ratio in the crevices than in the protuberances. Because the passivation is preferential, with the crevices passivated to a greater degree than the protuberances, the subsequent etch preferentially removes the protuberances. In this manner the protuberances are shaved down, reducing roughness. FIG. 3 shows an example of a feature schematically illustrating crevices including a passivation material and protuberances to be etched. It should be noted that the technique may be applied to positive features such as pillars and negative features such as holes, with the protuberance reduction decreasing or increasing the CD accordingly.

In some embodiments, an atomic layer etching (ALE) process may be used to etch the protuberances. ALE processes are described in Kanarik et al., "Overview of Atomic Layer Etching in the Semiconductor Industry," J. Vac. Sci. Technol. A 33(2), March/April 2015, incorporated by reference herein for the purpose of describing ALE. In an ALE process, the surface of a feature may be exposed to a surface modification chemistry to form a thin reactive surface layer. Examples of surface modification chemistries include chlorinating chemistries such as Cl2 for etch of silicon and oxides, fluorocarbons for etch of dielectrics, and oxidation chemistries such as O2. After surface modification, a removal operation removes the reactive surface layer without removing the underlying material. Low energy ion bombardment may be used. In the example of FIG. 3, the crevices are preferentially passivated leaving the protuberances exposed to be preferentially etched in one or more cycles of ALE. The thin passivation layer may be deposited from the surface modification chemistry or in a separate operation prior to the surface modification. Other etch processes may be used instead of ALE, including continuous etch processes.

Examples of process sequences may include: deposition of passivation layer→one or more etch cycles; deposition of passivation layer→one or more etch cycles→deposition of passivation layer→one or more etch cycles.

In one example, a patterned EUV resist may be exposed to an inductively coupled plasma (ICP) generated from CH4/H2 to preferentially passivate crevices of the patterned features. This may be followed by an O2 (modification)/Ar (removal) ALE process.

In some embodiments, an ALE process in which a surface modification layer is preferentially deposited on the protuberances is used. Because the removal operation removes only the surface modified layer, the protuberances are preferentially removed.

Shrink Plus Growth Smoothing

Figure 4A:
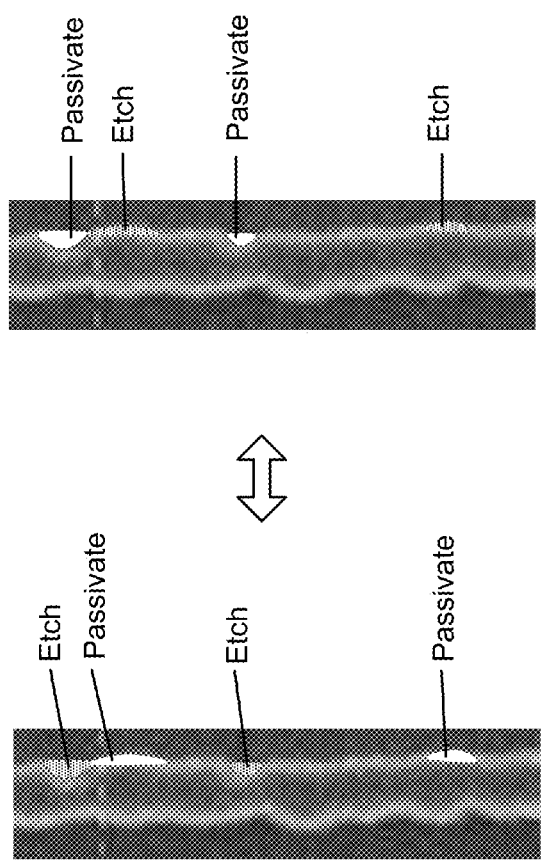
FIG. 4A shows a schematic example of a shrink and growth processes performed on a line to reduce roughness.
Figure 4B:
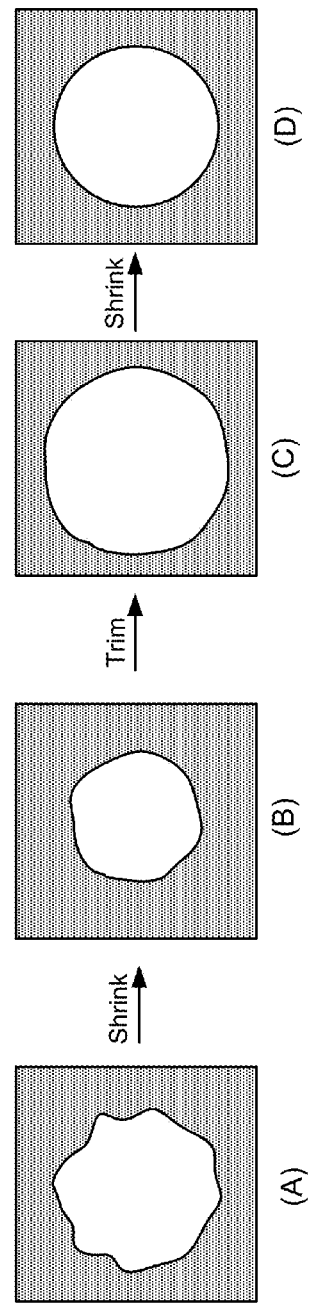
FIG. 4B shows a schematic example of a shrink and growth processes performed on a hole to reduce roughness and critical dimension.

In some embodiments, shrink and growth processes are performed on a feature, with roughness reduced with each shrink operation and each growth operation. This is represented in FIG. 4A for a line. FIG. 4B shows a rough schematic example of top-down views of a shrink+trim+shrink+trim sequence to obtain a smooth contact hole having the desired CD. First, an etched hole is provided at (A). The hole may be formed in a resist or in one or more intermediate layers, for example. The hole is shrunk to arrive at (B), with the process reducing roughness. Shrinking a hole and reducing roughness may involve using an appropriate passivation chemistry in an ALE or continuous process to preferentially deposit a passivation layer in crevices. Next, the resist or other material surrounding the hole is trimmed to increase CD and reduce roughness. See (C). As above, a trim may involve an appropriate passivation chemistry in an ALE or continuous etch. The hole may then be shrunk again to recover the target CD and further reduce roughness at (D). A shrink+growth cycle may be repeated multiple times to step down roughness. By cycling back and forth between shrinking and growing a feature, roughness can be reduced without requiring much space on the substrate for a feature. For example, a 40 nm feature may be printed at 40 nm and smoothed by shrinkage and growth between 36 nm and 41 nm. This can be useful if there is not much room to print on the substrate due to dense features.

Accelerated Smoothing with Feature Radius

Figure 5:
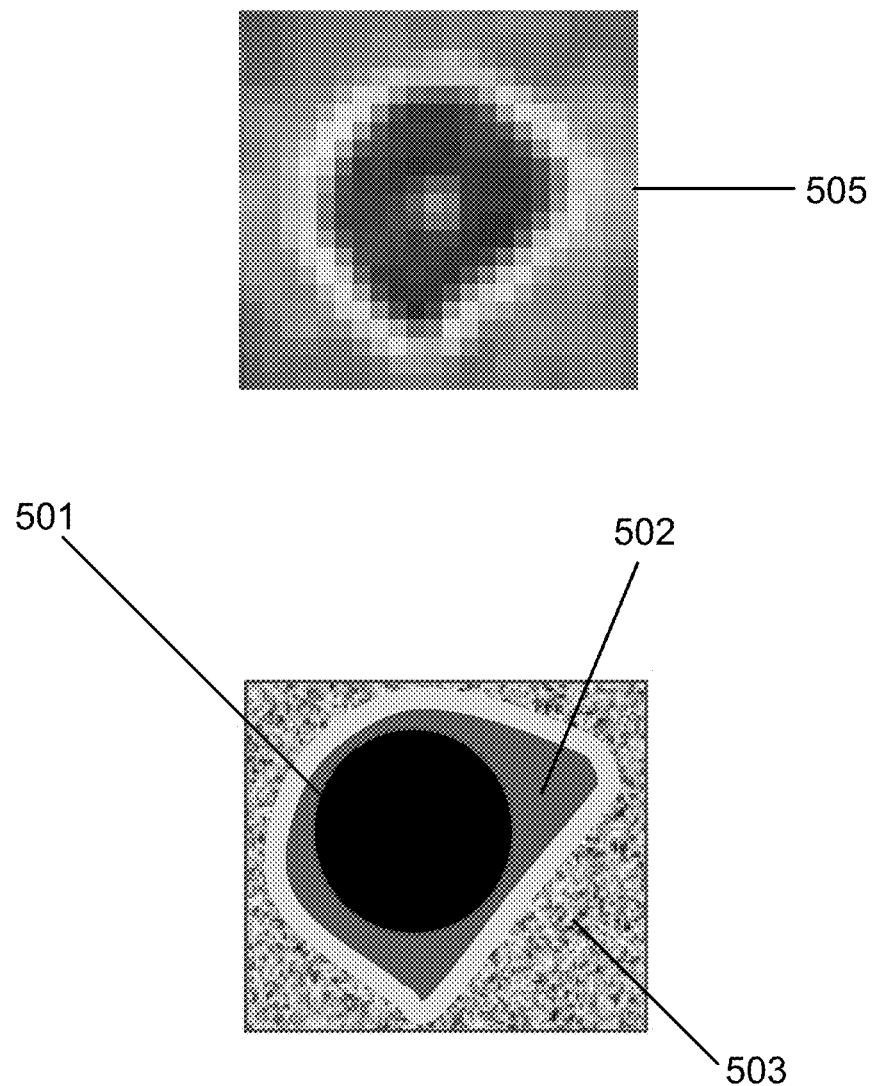
FIG. 5 shows a schematic example of preferential passivation of a rough contact hole.

In some embodiments, a passivation layer that is thicker than the smallest radius of curvature of critical features is deposited. This results in preferentially rounding rough incoming features by pinching off in corners that have high surface to volume ratios. FIG. 5 shows a schematic example of preferential passivation of a rough contact hole. At 505, a rough resist image for a circular hole is shown. As can be seen from the image, the nominally circular feature has squared-off edges. During the etching process, a passivation layer 502 is preferentially deposited at the corners. Hole 501 is etched in material 503, which may be the resist or an underlayer as described above. Because the passivation material deposits preferentially in high surface area to volume ratio areas, the process can preferentially smooth the roughest areas of the features. The feature gets progressively smoother as the etch proceeds down. As example, a C4F8 or C4F6 fluorocarbon may be used to preferentially deposit a passivation layer in corners in an etch of dielectric. In another example, a sulfur-containing compound may be used to preferentially deposit a passivation layer in corners in an etch of a carbon hard mask.

Tone Inversion Based EUV Resist Smoothing

Figure 6:
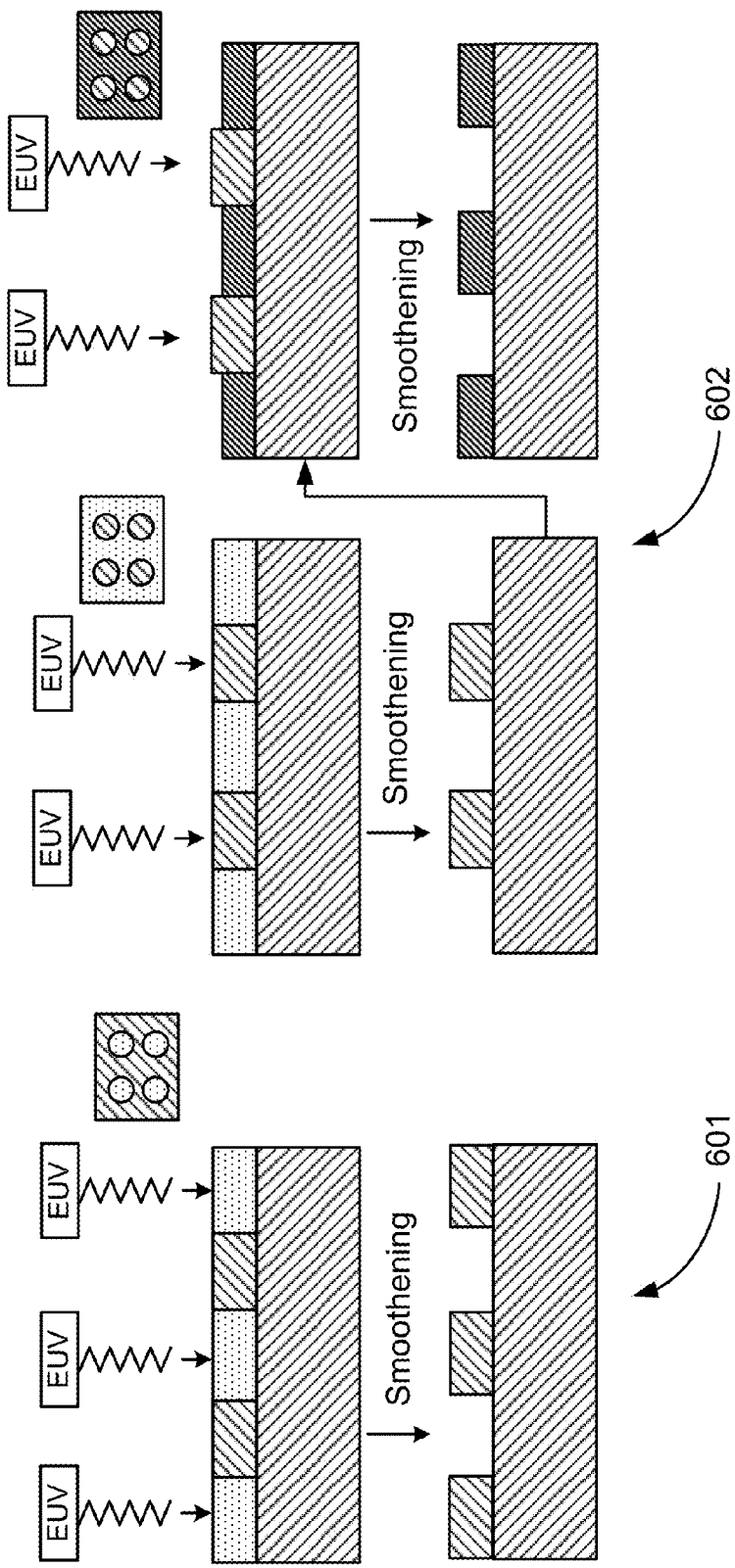
FIG. 6 shows a schematic example of smoothening during a tone inversion patterning process.

In some embodiments, tone inversion is used to increase roughness reduction. As depicted in FIG. 6, by using tone inversion (602) two smoothening opportunities are provided. Without tone inversion (601), one smoothening opportunity is provided. In 602, features may be optionally smoothed, for example using one or more techniques as described above, during the first smoothening opportunity. Protuberances are reduced, but the recessed roughness may be protected. The efficacy of this technique may be limited due to the target CD, which limits total removal. However, following the protuberances reduction in the first smoothening operation, a planarizing deposition is performed and the initial mandrel removed. This results in previously concave features becoming protuberances of the inverted tone images and inverts the CD of the feature. The newly formed protuberances may be reduced as above.

Examples of processes that implement tone inversion are described in U.S. patent application Ser. No. 14/101,901, filed Dec. 10, 2013, and titled "IMAGE REVERSAL WITH AHM GAP FILL FOR MULTIPLE PATTERNING," which is incorporated by reference herein. The smoothening techniques described herein may be applied at any appropriate stage of the image reversal processes described therein.

In a tone inversion or image reversal process, a combination of positive and negative resists may be used. In the example of FIG. 6, a masked negative photoresist layer may be disposed over a substrate including a layer to be patterned. The masked negative photoresist layer is exposed to EUV and developed to create an opening for a pattern. Smoothening by one or more of the techniques described herein may be performed during or after the development of the negative photoresist layer. A positive photoresist may then be exposed to EUV to pattern the holes. Smoothening by one or more of the techniques described above may be performed during or after the development of the negative photoresist layer.

Modification of Pattern Transfer Layers

As described above with reference to FIG. 1, in some embodiments, there may be one or more layers between a resist and a target layer. In some embodiments, these layers are configured to enhance smoothing during the etch process. The modification may be made to adjust the etch rate and/or the sticking coefficient of the layer. The layers may be modified as-deposited or by implanting dopants. As an example, an n-dopant may be included in a silicon layer to modify the etch selectivity. Additional examples of dopants include Co, W, Ti, Ta, Hf, Sn, As, B, Ge, and P.

Reducing LCDU in an Array of Holes

In some embodiments, LCDU may be reduced in an array of holes or other features formed in photoresist after lithography and prior to etch of the underlying material. LCDU may characterize the variation of hole size (e.g., diameter) across a relatively small area of an area, e.g., a 200 nm×200 nm portion. In some embodiments, one or more cycles of 1) depositing a thin layer in a plurality of holes formed in photoresist, the holes having different CDs, wherein the thin layer preferentially deposits in the larger CD holes, and 2) anisotropically removing the thin layer to remove it at the bottoms of the holes, is performed.

The layer will deposit on the sidewalls and on the bottoms of the holes, but be removed in the bottoms of the holes. Because the layer deposits preferentially in the larger holes, the sidewall thickness will grow there preferentially to the smaller holes, making the CD more uniform.

Deposition chemistries may depend on the etch chemistry as well as the material on which the film is deposited on. Any appropriate chemistry may be used, with examples including sulfur-containing such as sulfur dioxide (SO2) compounds to be deposited on amorphous carbon (a-C) films, fluorocarbons such as C4F6 and C4F8 to be deposited on amorphous silicon (a-Si) and oxide films, and methane (CH4) or other alkanes to be deposited on resist polymers. Hydrogen bromide (HBr) may also be used to passivate carbon-containing and silicon-containing films. The removal chemistry may also depend on the deposition chemistry as well as on the material the film is deposited on. In one example, a CH4/N2 deposition chemistry is followed by a N2 removal chemistry.

Figure 8:
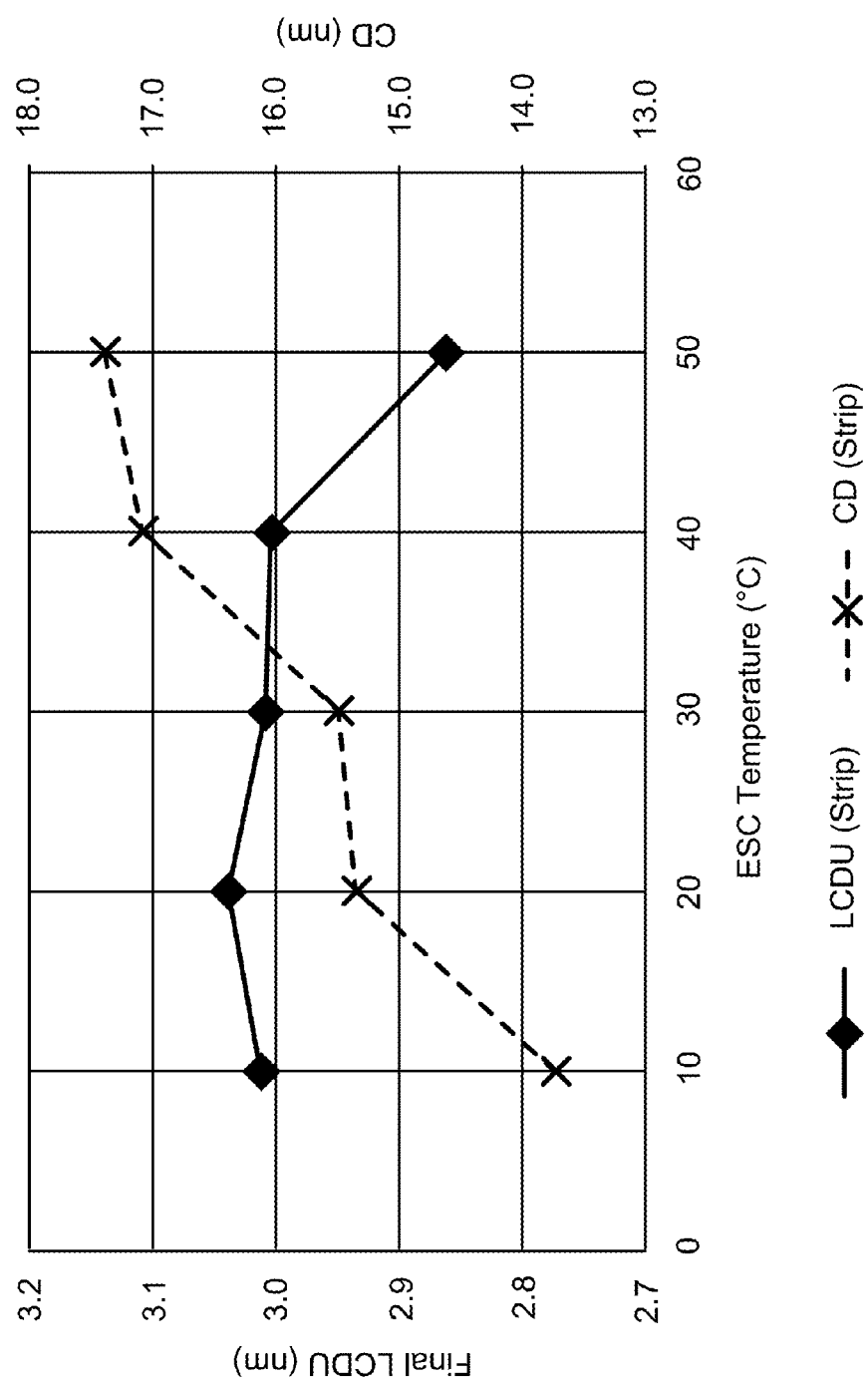
FIG. 8 shows the effect of electrostatic chuck (ESC) temperature on a multicycle deposition-removal process performed to reduce CD on a contact hole pattern in a resist.

It should be noted that the above operations may be used to improve LCDU while lowering the CD of the lithography-defined holes. In some embodiments, substrate temperature may be controlled to independently tune LCDU and CD. See FIG. 8, which shows the effect of electrostatic chuck (ESC) temperature on a multicycle deposition-removal process performed to reduce CD on contact hole pattern in a resist. ESC temperature correlates to substrate temperature. As can be seen from FIG. 8, the LCDU is relatively insensitive to ESC temperature, while the CD is sensitive to ESC temperature. This allows independent tuning of LCDU and CD.

Figure 9:
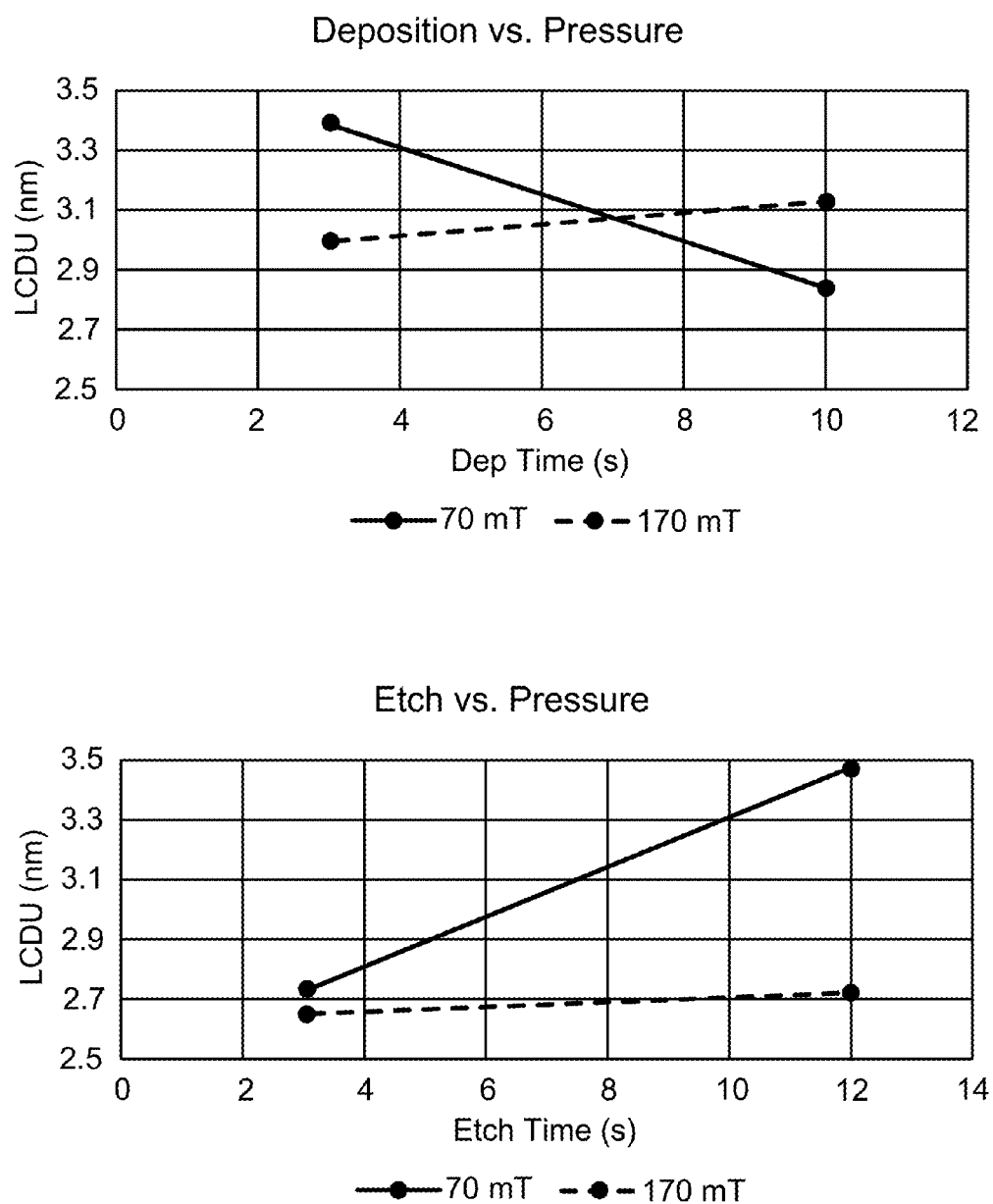
FIG. 9 shows LCDU for two different pressures as a function of deposition time and removal time for a multicycle deposition-removal process performed to reduce CD on a contact hole pattern in a resist.

In some embodiments, the deposition and removal operations are performed at different pressures, with pressure higher during the removal. FIG. 9 shows the LCDU for two different pressures as a function of deposition time and removal time. At lower pressures, longer deposition improves the LCDU. At higher pressures, the removal time as a minimal effect on LCDU. The deposition favors lower pressures while removal favors higher pressures.

EXAMPLES

An example of a multi-layer stack to which the smoothing techniques may be applied is as follows: the target layer may be a silicon oxide-based layer, such as a TEOS layer about 1500 Å thick. On top of the target layer may be a first underlayer of amorphous carbon, which may be an ashable hardmask. The amorphous carbon layer may be robust and have a high modulus, particularly to maintain the fine pattern when it is patterned in subsequent steps. Example thicknesses of the amorphous carbon layer may be about 400 Å or about 900 Å. On top of the amorphous layer may be a second underlayer of amorphous silicon, which has high etch contrast with amorphous carbon. In some embodiments the amorphous silicon is doped. In some embodiments, the amorphous silicon is undoped. This layer may be about 100 Å thick. On top of the amorphous silicon layer may be an atomically smooth layer. The amorphous silicon layer may have high etch contrast with the atomically smooth layer. The atomically smooth layer may be a silicon oxide layer about 30 Å to about 60 Å thick, and may be deposited such that the roughness of the film is less than a monolayer. For example, the average roughness of the atomically smooth layer may be about 2 Å. On top of the atomically smooth layer may be a photoresist layer.

An example of smoothing pattern transfer of a contact hole into a silicon oxide layer using a multi-layer stack as described above is as follows:

Oxide/a-Si etch: 600 W TCP/120 Vb (200 Hz, 50% DC)/SF6/CH2F2/N2/He

Open a-C hardmask: 440 W TCP/150 Vb/SO2/O2

A bias pulsed TCP (transformer coupled plasma) may be used to etch the oxide and a-Si layers, with CH2F2 providing a passivation layer that preferentially deposits in the corners of the contact holes during etching as described above with respect to FIG. 5. During the a-C hard mask open, sulfur may preferentially form a passivation layer in the corners of the contact holes.

An example of smoothing during pattern transfer of a grating pattern into a silicon oxide layer using a multi-layer stack as described above is as follows:

Resist growth/shrink: x times [oxidation (O2 50 W TCP/0 bias voltage (Vb), 1 second)+argon removal (Ar 300 W TCP/20 Vb/2 seconds)+polymer passivation layer (CH4/H2 700 W TCP/4 seconds]

The above is an example of a shrink/growth smoothening as described above with respect to FIGS. 4A and 4B. During the oxidation and argon operations, the contact hole is grown (with the resist trimmed) and during passivation, the contact hole is shrunk. In an example, the polymer passivation layer may be formed preferentially in recesses of a feature, such that the O2/Ar etch removes the passivated material less quickly.

The oxide/a-Si etches and a-C hardmask open may be performed as described above.

Examples of improving LCDU in an array of holes are described. Ten cycles of deposition (3 s) and etch (5 s) in a multi-cycle deposition/removal process as described above were performed to improve LCDU in a resist. Chamber pressure was 120 mT. A pulsed TCP plasma was employed at 200 W/50 W pulsing. A nominal CD of 22 nm was used. Deposition chemistry was CH4/N2 and removal chemistry was N2. LCDU and CD were measured as a function of temperature, with results shown in FIG. 8.

Multiple cycles of 10 s deposition and 3 s etch in a multi-cycle deposition/removal process as described above were performed to improve LCDU in a resist. Chamber pressure was varied. Temperature was 30° C. A pulsed TCP plasma was employed at 200 W/50 W pulsing. A nominal CD of 22 nm was used. Deposition chemistry was CH4/N2 and removal chemistry was N2. LCDU was measured as a function of pressure for the deposition and etch, with results shown in FIG. 9.

Apparatus

Disclosed embodiments may be performed in a process chamber, such as a plasma etch chamber. For example, the methods described above may be performed in an inductively coupled plasma or a capacitively coupled plasma chamber, or a downstream plasma chamber.

Figure 7:
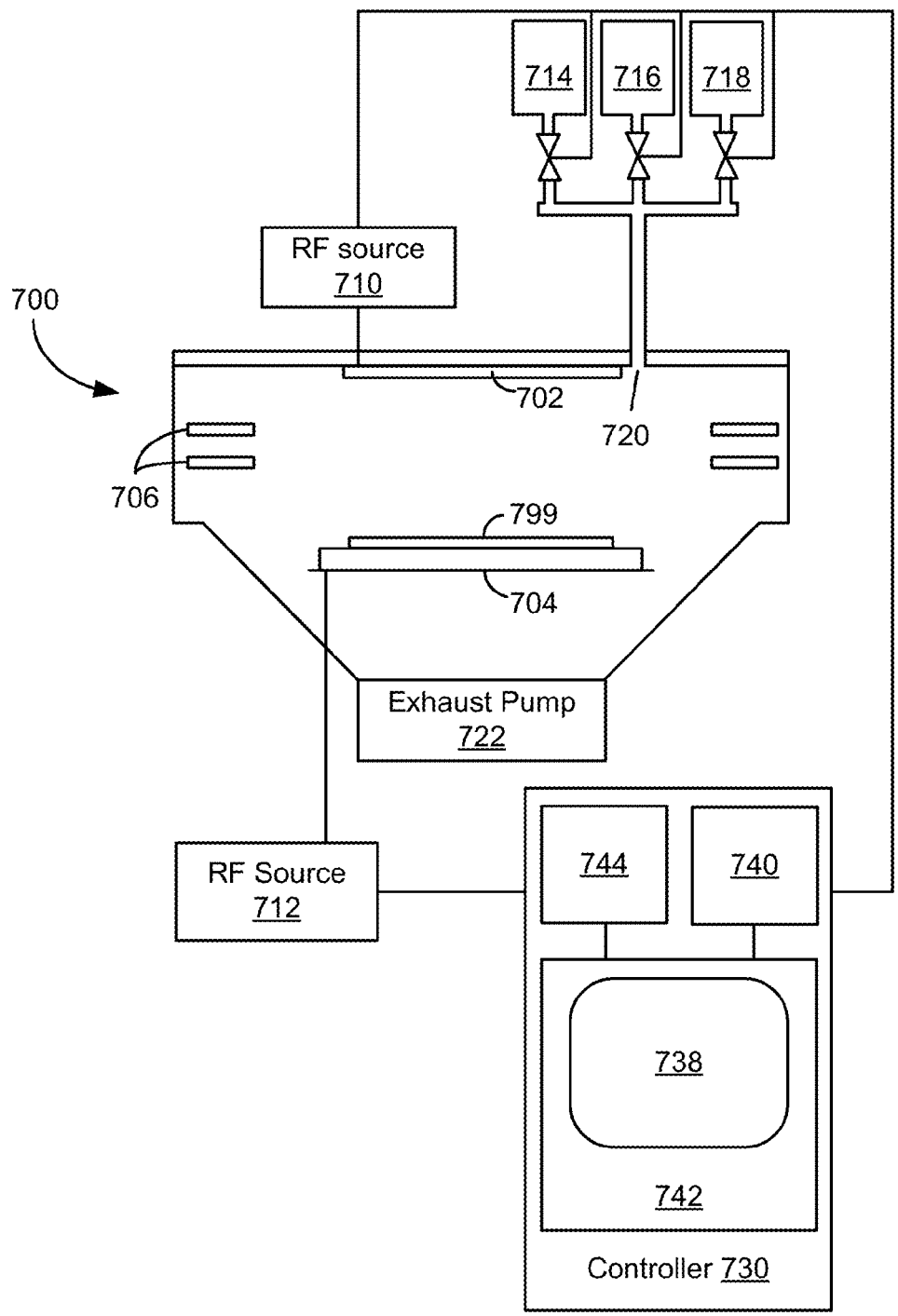
FIG. 7 is a schematic depiction of an example of a plasma etch chamber according to various embodiments.

FIG. 7 is a schematic depiction of an example of a plasma etch chamber according to various embodiments. The plasma etch chamber 700 includes an upper electrode 702 and a lower electrode 704 between which a plasma may be generated.

A substrate 799 having an EUV patterning thereon as described above may be positioned on the lower electrode 704 and may be held in place by an electrostatic chuck (ESC). Other clamping mechanisms may also be employed. The plasma etch chamber 700 includes plasma confinement rings 706 that keep the plasma over the substrate and away from the chamber walls. Other plasma confinement structures, e.g. as a shroud or a dome that acts an inner wall, may be employed. In some embodiments, the plasma etch chamber 700 may not include any such plasma confinement structures.

In the example of FIG. 7, the plasma etch chamber 700 includes two radio frequency (RF) sources with RF source 710 connected to the upper electrode 702 and RF source 712 connected to the lower electrode 704. Each of the RF sources 710 and 712 may include one or more sources of any appropriate frequency including 2 MHz, 13.56 MHz, 27 MHz, and 60 MHz. Gas may be introduced to the chamber 700 from one or more gas sources 714, 716, and 718. For example, the gas source 714 may include an inert gas, the gas source 716 may include an etchant and the gas source 718 may include a passivating gas. Gases may be introduced to the chamber through inlet 720 with excess gas and reaction byproducts exhausted via exhaust pump 722. One example of a plasma etch chamber that may be employed is a 2300® Flex™ reactive ion etch tool available from Lam Research Corp. of Fremont, Calif. Further description of plasma etch chambers may be found in U.S. Pat. Nos. 6,841,943 and 8,552,334, which are herein incorporated by reference in their entireties.

Returning to FIG. 7, a controller 730 is connected to the RF sources 710 and 712 as well as to valves associated with the gas sources 714, 716, and 718, and to the exhaust pump 722. In some embodiments, the controller 730 controls all of the activities of the plasma etch chamber 700. The controller 7 may execute control software 738 stored in mass storage device 740, loaded into memory device 742, and executed on processor 744. Alternatively, the control logic may be hard coded in the controller 730. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. Control software 738 may include instructions for controlling the timing, mixture of gases, gas flow rates, chamber pressure, chamber temperature, wafer or pedestal temperature, RF frequency, RF power levels, substrate pedestal, chuck and/or susceptor position, and other parameters of a particular process performed by plasma etch chamber 700. Control software 738 may be configured in any suitable way. For example, various process tool component subroutines or control objects may be written to control operation of the process tool components used to carry out various process tool processes. The control software 738 may be coded in any suitable computer readable programming language.

In some embodiments, the control software 738 may include input/output control (IOC) sequencing instructions for controlling the various parameters described above. Other computer software and/or programs stored on mass storage device 740 and/or memory device 742 associated with the controller 730 may be employed in some embodiments. Examples of programs or sections of programs for this purpose include a process gas control program, a pressure control program, and RF source control programs.

A process gas control program may include code for controlling gas composition (e.g., fluorinating gases, fluidic silicon sources, oxidants, as described herein) and flow rates and optionally for flowing gas into a chamber prior to etch to stabilize the pressure in the chamber. A pressure control program may include code for controlling the pressure in the chamber by regulating, for example, a throttle valve in the exhaust system of the chamber, a gas flow into the chamber, etc. A RF source control program may include code for setting RF power levels applied to the electrodes in accordance with the embodiments herein.

In some embodiments, there may be a user interface associated with the controller 730. The user interface may include a display screen, graphical software displays of the apparatus and/or process conditions, and user input devices such as pointing devices, keyboards, touch screens, microphones, etc.

In some embodiments, parameters adjusted by controller 730 may relate to process conditions. Non-limiting examples include process gas composition and flow rates, pedestal temperature, solid silicon source temperature, pressure, plasma conditions (such as RF bias power levels, current in zones of a multi-zone coil), etc. These parameters may be provided to the user in the form of a recipe, which may be entered utilizing the user interface.

Signals for monitoring the process may be provided by analog and/or digital input connections of system controller 730 from various process tool sensors. The signals for controlling the process may be output on the analog and digital output connections of the plasma etch chamber 700. Non-limiting examples of sensors that may be monitored include mass flow controllers, pressure sensors (such as manometers), thermocouples, etc. Appropriately programmed feedback and control algorithms may be used with data from these sensors to maintain process conditions.

The controller 730 may provide program instructions for implementing the above described selective etch processes. The program instructions may control a variety of process parameters, such as RF bias power level, current in zones of a multi-zone coil, pressure, pedestal temperature, solid silicon source temperature, gas flow rate, etc. The instructions may control the parameters to selectively etch silicon nitride films according to various embodiments described herein.

A controller 730 will typically include one or more memory devices and one or more processors configured to execute the instructions so that the apparatus will perform a method in accordance with disclosed embodiments. Machine-readable media including instructions for controlling process operations in accordance with disclosed embodiments may be coupled to the controller 330, for example, as described above.

In some implementations, the controller 730 may be or form part of a system controller that is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller, depending on the processing conditions and/or the type of system, may be programmed to control any of the processes disclosed herein, including the delivery of processing gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The system controller, in some implementations, may be a part of or coupled to a computer that is integrated with, coupled to the system, otherwise networked to the system, or a combination thereof. For example, the system controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the system controller is configured to interface with or control. Thus as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, a strip chamber or module, and any other semiconductor processing systems that may be associated or used in the fabrication and/or manufacturing of semiconductor wafers.

As noted above, depending on the process step or steps to be performed by the tool, the system controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method comprising:
receiving a substrate including a plurality of holes including sidewalls and bottoms patterned in one or more layers on the substrate, the holes patterned with a nominal critical dimension (CD) and having a first local critical dimension uniformity (LCDU) (3 sigma), wherein the plurality of holes includes holes of different sizes and LCDU (3 sigma) characterizes the variation in hole size of the plurality of holes; and
reducing the LCDU (3 sigma) of the plurality of holes, wherein reducing the LCDU (3 sigma) comprises performing a multi-cycle deposition-etch operation in the one or more layers, wherein each cycle comprises:
(a) depositing a first material in the holes including on the sidewalls and bottoms of the holes and
(b) anisotropically removing the first material from holes to remove the first material from the bottoms of the holes, wherein a chamber pressure of chamber in which the substrate is disposed is higher during (b) than (a), wherein the holes have a second LCDU (3 sigma) after the multi-cycle deposition-etch operation with the second LCDU (3 sigma) being less than the first LCDU (3 sigma), and wherein (a) comprises preferentially depositing the first material in larger ones of the plurality of holes.

2. The method of claim 1, wherein the holes are patterned with an EUV dose of less than about 40 mJ/cm$^2$.

3. The method of claim 1, wherein the second LCDU (3 sigma) is less than 3 nm.

4. The method of claim 3, wherein the first LCDU (3 sigma) is greater than 5 nm.

5. The method of claim 1, wherein the difference between the first and second LCDU (3 sigma) is at least 1 nm.

6. The method of claim 1, wherein the multi-cycle deposition-etch operation is a plasma-assisted operation.

7. The method of claim 1, wherein the multi-cycle deposition-etch operation is performed in a single chamber and transitioning between deposition and etch comprises changing the chamber pressure.

8. The method of claim 1, wherein the one or more layers comprises a polymeric or non-polymeric resist and (a) comprises exposing the pattern of holes to methane ($CH_4$).

9. The method of claim 8, wherein (b) comprises exposing the pattern of holes to plasma generated from nitrogen ($N_2$) gas.

10. The method of claim 1, further comprising decreasing the CD during the multi-cycle deposition-etch operation such that the holes have a second CD after the multi-cycle deposition-etch operation, with the second CD is less than the first CD.

11. The method of claim 1, further comprising increasing the CD during the multi-cycle deposition-etch operation such that the holes have a second CD after the multi-cycle deposition-etch operation, with the second CD is greater than the first CD.

12. A method comprising:
receiving a substrate including a feature selected from a line or hole patterned by EUV in one or more layers on the substrate, the feature including sidewalls having crevices and protuberances;
depositing a passivation layer on the feature sidewalls such that the passivation layer preferentially deposits in crevices leaving protuberances exposed; and
etching the feature to remove the exposed protuberances.

13. The method of claim 12, wherein the one or more layers includes an amorphous carbon film and depositing a passivation layer comprises exposing the feature to a plasma generated from a sulfur oxide.

14. The method of claim 12, wherein the one or more layers includes an amorphous silicon film and depositing a passivation layer comprises exposing the feature to a plasma generated from a fluorocarbon.

15. The method of claim 12, wherein the one or more layers includes a resist polymer and depositing a passivation layer comprises exposing the feature to a plasma generated from methane.

16. The method of claim 12, wherein removing the exposed protuberances comprises an atomic layer etching (ALE) process.

* * * * *